US006859796B1

(12) United States Patent
Seward

(10) Patent No.: US 6,859,796 B1
(45) Date of Patent: Feb. 22, 2005

(54) METHOD OF USING MULTIPLE POPULATIONS WITH CROSS-BREEDING IN A GENETIC ALGORITHM

(75) Inventor: Robert Y. Seward, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 468 days.

(21) Appl. No.: 09/907,904

(22) Filed: Jul. 19, 2001

(51) Int. Cl.$^7$ ............................................ G06N 5/00
(52) U.S. Cl. ........................................ 706/13; 706/45
(58) Field of Search ........................... 706/13, 12, 8; 705/4

(56) References Cited

U.S. PATENT DOCUMENTS

| | | | | |
|---|---|---|---|---|
| 4,935,877 A | | 6/1990 | Koza | 706/13 |
| 4,961,152 A | * | 10/1990 | Davis | 706/13 |
| 5,255,345 A | | 10/1993 | Shaefer | 706/13 |
| 5,343,554 A | * | 8/1994 | Koza et al. | 706/13 |
| 5,581,657 A | * | 12/1996 | Lyon | 706/13 |
| 5,839,120 A | | 11/1998 | Thearling | 706/13 |
| 5,970,487 A | | 10/1999 | Shackleford et al. | 707/6 |
| 6,182,057 B1 | | 1/2001 | Kikuchi et al. | 706/13 |
| 6,480,832 B2 | * | 11/2002 | Nakisa | 706/13 |
| 2002/0062296 A1 | * | 5/2002 | Nakisa | 706/15 |
| 2002/0095393 A1 | * | 7/2002 | McHaney | 706/13 |
| 2003/0055614 A1 | * | 3/2003 | Pelikan et al. | 703/2 |
| 2003/0088458 A1 | * | 5/2003 | Afeyan et al. | 705/10 |

OTHER PUBLICATIONS

Anderson et al., "Genetic Algorithms for Combinatorial Optimization: The Assembly Line Balancing Problem", ORSA Journal on Computing, 1994, vol. 6, pp 161–173.*
Shapcott, "Index Tracking: Genetic Algorithms for Investment Portfolio Selection", NEC Research Index, Sep. 1992, Retrieved from the Internet: http://citeseer.nj.nec.com/shapcott92index.html.*
Allenson, "Genetic Algorithms with Gender for Multi-function Optimisation", NEC Research Index, Sep. 1992, Retrieved from the Internet: http://citeseer.nj.nec.com/allenson92genetic.html.*

(List continued on next page.)

Primary Examiner—Wilbert L. Starks, Jr.

(57) ABSTRACT

A method is disclosed for processing data to identify optimal solutions to a problem using a genetic algorithm. Multiple populations of data entries, referred to as solutions, are created and kept separate from each other. Solutions are rated based on their desirability. Solutions from one population are combined, or "cross-bred," with solutions from another population to create offspring solutions. The offspring of the cross-over are associated with one of the parent populations and rated. The most desirable solutions within a population are selected from the parent and offspring solutions to form the next generation of solutions. The remaining solutions may be discarded from the population. The cross-over and selection steps may then be repeated using second-generation solutions to create a third generation. The method may be implemented, for example, to design the layout of a circuit board. Diversity of solutions is increased by keeping the populations separate but allowing cross-breeding.

20 Claims, 5 Drawing Sheets

OTHER PUBLICATIONS

Muhlenbein, "Genetic Algorithms", NEC Research Index, 1997, Retrieved from the Internet: http://citeseer,nj.nec.com/5844.htm.*

Hoffmeister et al., "Genetic Self–Learning", Proceedings of the 1st European Conference on Artificial Life, 1992.*

Yang, "Line–breeding Schemes for Combinatorial Optimization", Proceedings of the 5th International Conference on Parallel Problem Solving from Nature, Sep. 1998.*

Koza, "Genetically Breeding Populations of Computer Programs to Solve Problems in Artificial Intelligence", Proceedings of the 2nd International Conference on Tools for AI, 1990.*

Venkateswaran et al., "Cooperative Genetic Algorithm for Optimization Problems in Distributed Computer Systems", Technical Report TR–EECS–93–018, School of EECS, Washington State University, 1993.*

Chu et al., "The Effect of Population Structure on the Rate of Convergence of Genetic Algorithms", Proceedings of the 1993 ACM/SIGAPP Symposium on Applied Computing: States of the Art and Practice, 1993.*

Merkle et al., "Scalability of an MPI–Based Fast Messy Genetic Algorithm", Proceedings of the 1998 ACM Symposium on Applied Computing, 1998.*

Eick et al., "Learning Bayesian Classification Rules Through Genetic Algorithms", Proceedings of the $2^{nd}$ International Conference on Information and Knowledge Management, 1993.*

Liang et al., "A Sparse Matrix Representation For Production Scheduling Using Genetic Algorithms", Proceedings of the 1995 ACM Symposium on Applied Computing, 1995.*

Khuri et al., "The Zero/One Multiple Knapsack Problem and Genetic Algorithms", Proceedings of the 1994 ACM Symposium on Appied Computing,1994.*

Koza et al., "Automatic Programming of Robots Using Genetic Programming", Proceedings of the $10^{th}$ National Conference on Artificial Intelligence, 1992.*

* cited by examiner

METHOD OF USING MULTIPLE POPULATIONS WITH CROSS-BREEDING IN A GENETIC ALGORITHM

FIELD OF INVENTION

The present invention relates generally to software methods for identifying optimal solutions to problems. More particularly, it relates to a genetic algorithm for combining solutions from various populations to identify optimal solutions.

BACKGROUND

Various software methods are known for identifying optimal solutions to complicated problems. Some methods use genetic algorithms to identify various solutions. Genetic algorithms may be used to resolve any problem having parameters that define the scope of the problem and solution criteria used to judge the solution. Genetic algorithms may be used, for example, in an application for laying out an integrated circuit, where various layout solutions are possible. The algorithm may, for example, determine where components or cells of components should be positioned to achieve optimal utilization of chip area.

Genetic algorithms start with one or more populations of potential solutions, also referred to as chromosomes or genes. The initial populations may be generated, for example, at random. Within the population, these solutions are compared with other solutions to create new solutions, hopefully resulting in better solutions. The process of combining solutions is referred to as "cross-over" or "cross-breeding" because the resulting "offspring" solutions have characteristics of one or more "parent" solutions used in cross-over. Cross-over creates a variety of solutions that may be more or less optimal than their parent solutions. Offspring solutions may also be created by other methods of modifying the solutions, referred to as "mutation."

The offspring may be combined with the parent population, from which optimal solutions may be identified during a process of "competition," also referred to as "selection." Selection may simply remove less optimal solutions from the population. An example method may include several iterations of cross-over and selection, such that several generations of solutions are generated for the population. During this example process, mutations may occur to introduce more beneficial traits into the population. In one example, multiple populations may separately use this same process to create multiple solutions.

In existing methods, the offspring within a population tend to look very similar. The process of intra-population is overly degenerative, thereby causing a lack of diversity in the resulting solutions. Because of this lack of diversity, the solution generated by a population tends to be optimal only with respect to similar solutions and may not be optimal when considered in context of the entire problem. Mutation may provide some diversity, but does not solve the problem. Another method of creating diversity is to retain less optimal solutions during the process of competition. The problem with this method is that it keeps potentially bad solutions in the population and still results in less optimal solutions. What is needed is an improved genetic algorithm for identifying optimal solutions. In particular, what is needed is a method for introducing greater diversity into a genetic algorithm.

SUMMARY OF INVENTION

A method is disclosed for processing data to identify optimal solutions to a problem using a genetic algorithm. Multiple data populations are created and kept separate from each other. Each population has multiple data entries, referred to as solutions. The initial solutions in the population may be selected at random, based on input parameters related to a problem. Solutions are rated based on their desirability. Solutions from one population are combined, or "cross-bred," with solutions from another population to create offspring solutions. The offspring of the cross-over are us associated with one of the parent populations and rated. A selection process then selects the most desirable solutions as determined by criteria within a population from the parent and offspring solutions to form the next generation of solutions. The remaining solutions may be discarded from the population. The cross-over and selection steps may then be repeated to cross-over second-generation solutions to create a third generation. Other known methods may also be applied during the process, such as mutation steps and intra-population breeding, as desired. The method may be implemented, for example, to design the layout of a circuit board. Diversity of solutions is increased by keeping the populations separate but allowing cross-breeding.

A system and tangible computer-readable medium are also disclosed for processing data to identify optimal solutions, given input parameters and preferred output characteristics. The system and medium include a memory that stores data and executable instructions that process the data using a method. The data includes multiple separate populations of solutions. The method combines solutions from one population with solutions from another population during a cross-over step performed in a conventional manner. The cross-over produces offspring solutions from the parent solutions from the different populations. The offspring solutions are associated with at least one of the parent populations. A selection process occurs within each population to select the most desirable solutions from the parents and offspring to form the next generation of solutions. The remaining solutions may be discarded from the population. The next generation of solutions from one population may then be crossed with solutions from another population to create a second generation of offspring associated with one of the populations. Another selection process may then select the most desirable solutions to comprise the third generation.

DETAILED DESCRIPTION

Figure 1:
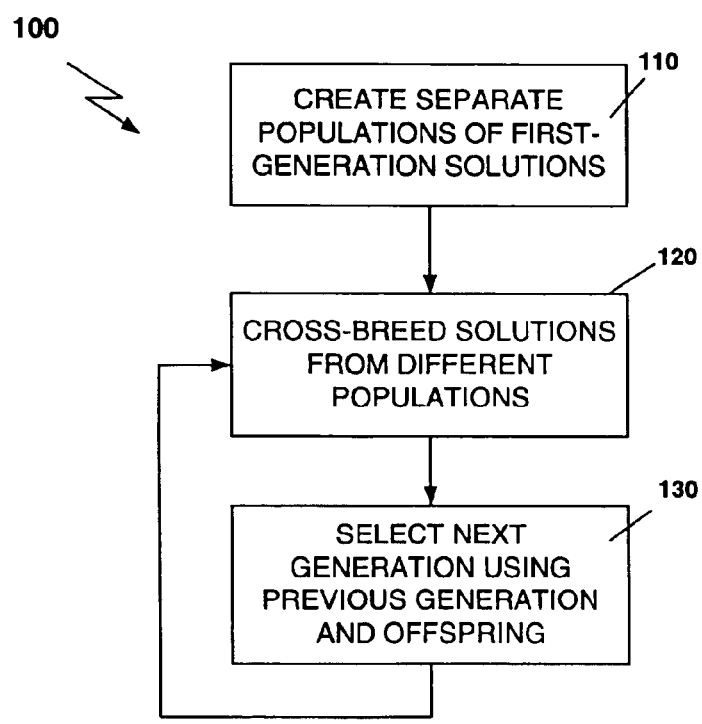
FIG. 1 shows a flow chart of the method.

FIG. 1 shows a flow chart of the method 100. Populations of solutions are created 110. As used herein, solutions include any entry or item of data in a population. Solutions may also be referred to as chromosomes. The current generation of solutions in the populations may evolve from one generation to the next using the method 100. Solutions from one population (the first generation or parent generation) are cross-bred 120 with first-generation solutions from another population using known cross-over methods. As used herein, the terms "combine," "cross-over," "cross-breed," and "cross" refer to any method of combining attributes from two or more solutions to create another solution, and may include, for example, any known genetic algorithms for combining solutions. The offspring created by the cross-over 120 are grouped with the population of one of the parents. The next generation of solutions for that population is selected 130 from solutions that comprise the parent generation and the offspring. One skilled in the art will recognize that the offspring may be selected 130 according to any desired characteristics. In one embodiment, a specified number of the highest-scored solutions may be selected 130. In another embodiment, a number of solutions may be selected at random. In still another embodiment, a combination of the highest-scored solutions and lower-scored solutions may be used to create diversity. The parent generation and the offspring for each population may then be discarded, or they may be stored, as desired.

The process 100 may then repeat the cross-over 120 and selection 130 steps using the second generations of various populations, and this cross-over-selection-repeat process may continue for numerous iterations. For example, in the second application of the cross-over 120 and selection 130 steps, the second generation solutions from separate populations are cross-bred 120 and third generation solutions are selected 130 within each population using a selection process that chooses among second-generation solutions and offspring solutions from the cross-over 120 of second generation solutions.

Figure 2:
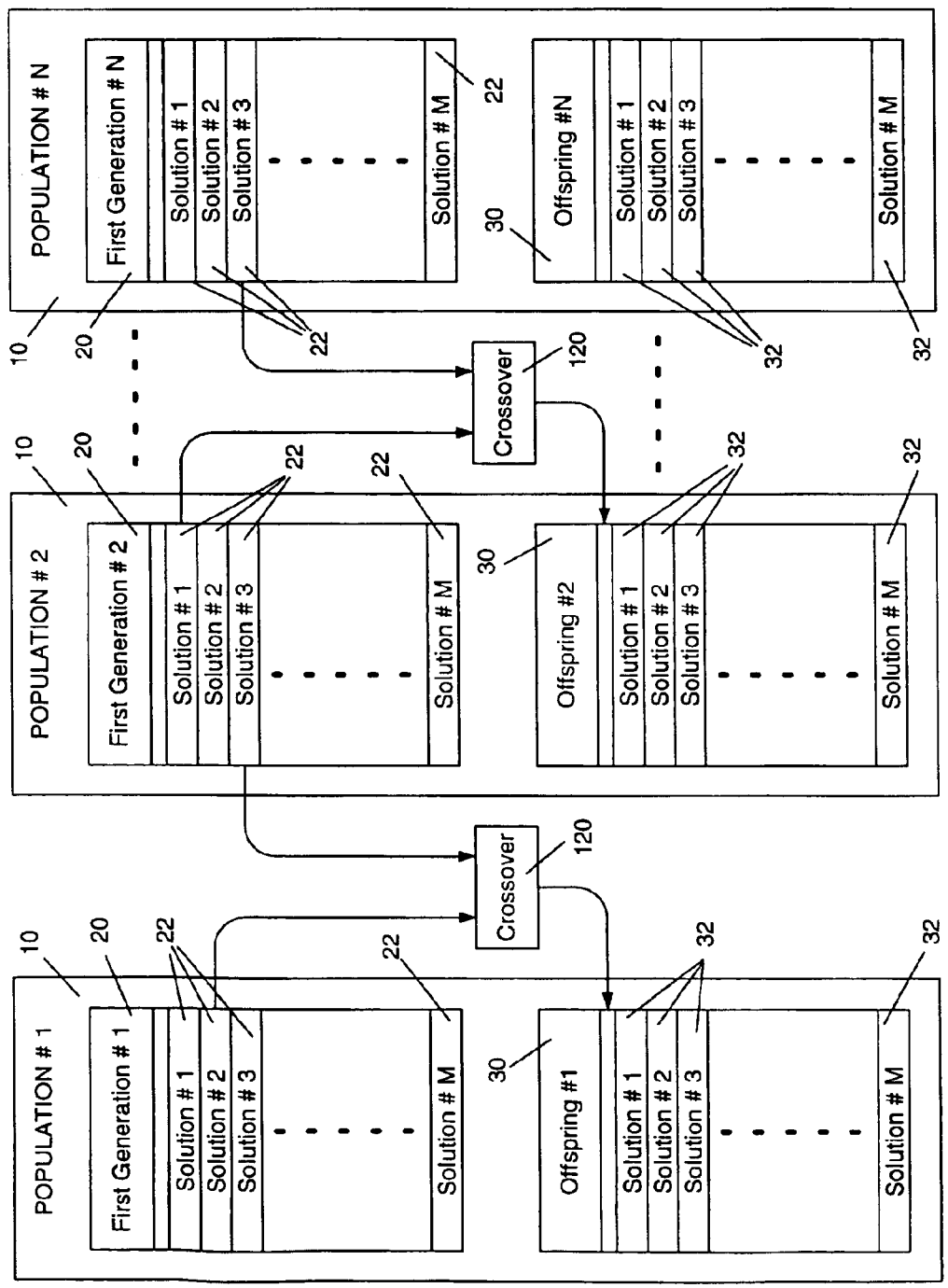
FIG. 2 shows a block diagram of a system that uses the method.

FIG. 2 shows a block diagram of a system on which the method 100 may be applied. FIG. 2 illustrates the application of the cross-over step 120 of the method 100. The system has multiple populations 10 that are cross-bred 120 by the method 100. Any number of populations 10 may be used and are shown as "Population #1, Population #2, Population #N." Each population 10 has a current generation 20 of solutions 22. A generation 20 may have any number of solutions 22, which are shown as "Solution #1, Solution #2 . . . Solution #M." In the example of FIG. 2, the current generations 20 are referred to as the "First Generations," although the current generations 20 may or may not be the first generations to which the method 100 is applied, for example, because the cross-over and selection steps 120, 130 of the method 100 may repeat.

Solutions 22 from first generations 20 in separate populations 10 are combined in a cross-over process 120 that "breeds" the solutions to produce an "offspring" solution 32. In the example of FIG. 2, Solution #2 from Population #1 is shown to be crossed with Solution #3 from Population #2. One skilled in the art will recognize that cross-over 120 step of the method 100 may be applied between any solution 22 in a particular population 10 and any particular solution 22 in another population 10. A single solution 22 may be crossed with multiple solutions 22 from another population 10 to create multiple offspring solutions 32 having a single parent. Also, solutions 22 from one population 10 may be crossed with solutions 22 from multiple other populations 10. The offspring solutions 32 are referred to collectively as the offspring 30. In one embodiment, such as that shown in FIG. 2, solutions 22 may be crossed 120 only between two populations 10, each first generation solution 22 may be crossed only once, and the offspring solutions 32 may number the same as the parent solutions 22, for example, 1-N for each. The offspring 30 are associated with one of the parent generations 20 and kept within the same population 10.

Figure 3:
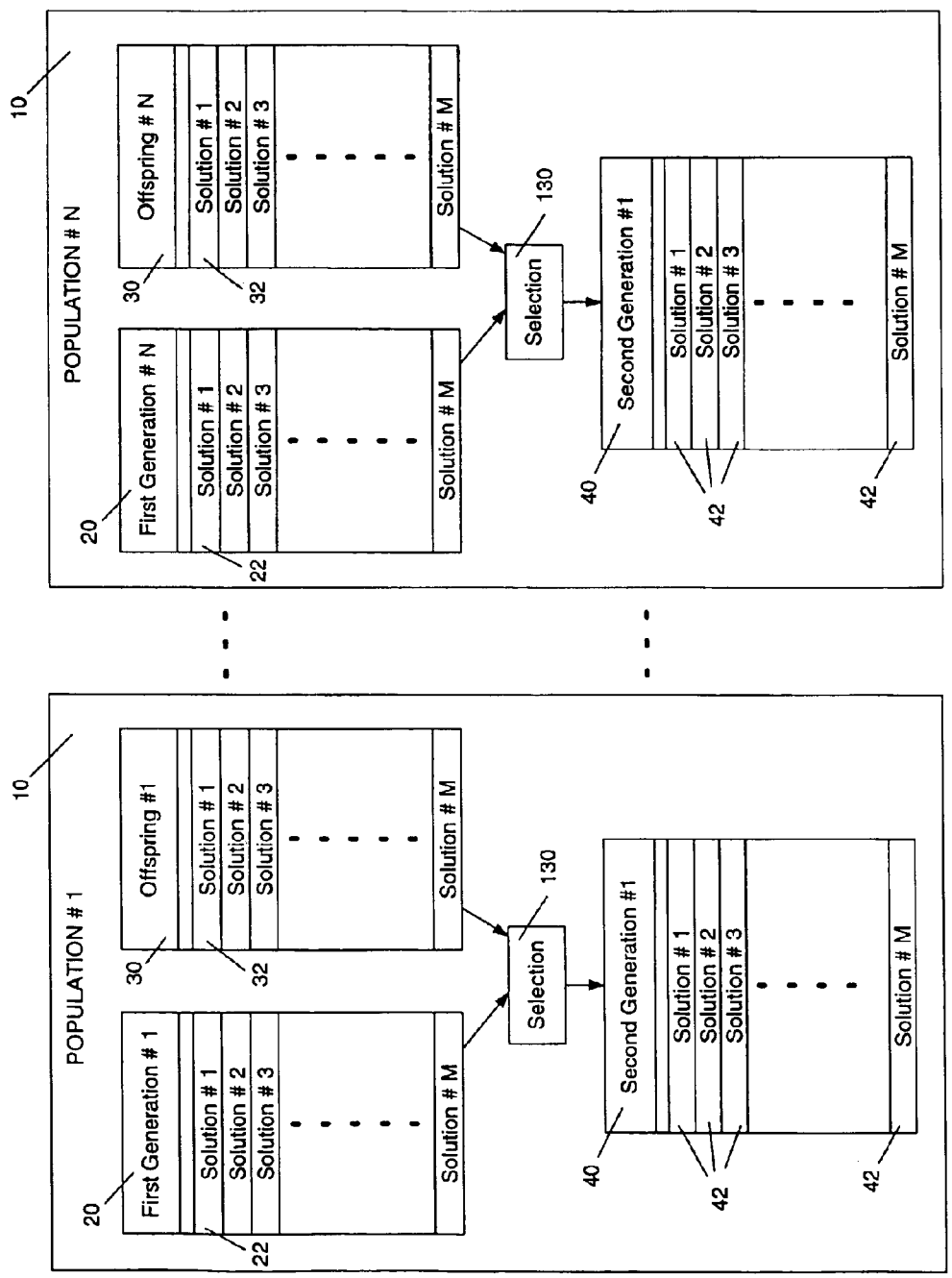
FIG. 3 shows a block diagram of a system that uses the method.

FIG. 3 shows a block diagram of a system that illustrates the application of the selection step 130 of the method 100. Within each population 10, solutions 22 from the first (parent) generation 20 are compared 130 with solutions 32 from the offspring 30 associated with the population 10. A second generation 40 of solutions 42 is selected 130 from the parent generation solutions 22 and the offspring-solutions 32 from the parent cross-over 120. The cross-over 120 and selection 130 steps may then be repeated to cross-over the second generation 40 with a second generation 40 from another population 10 or with any other set of solutions. The offspring and previous generations 30, 20 may be discarded after the selection process 130, or they may be saved.

Figure 4:
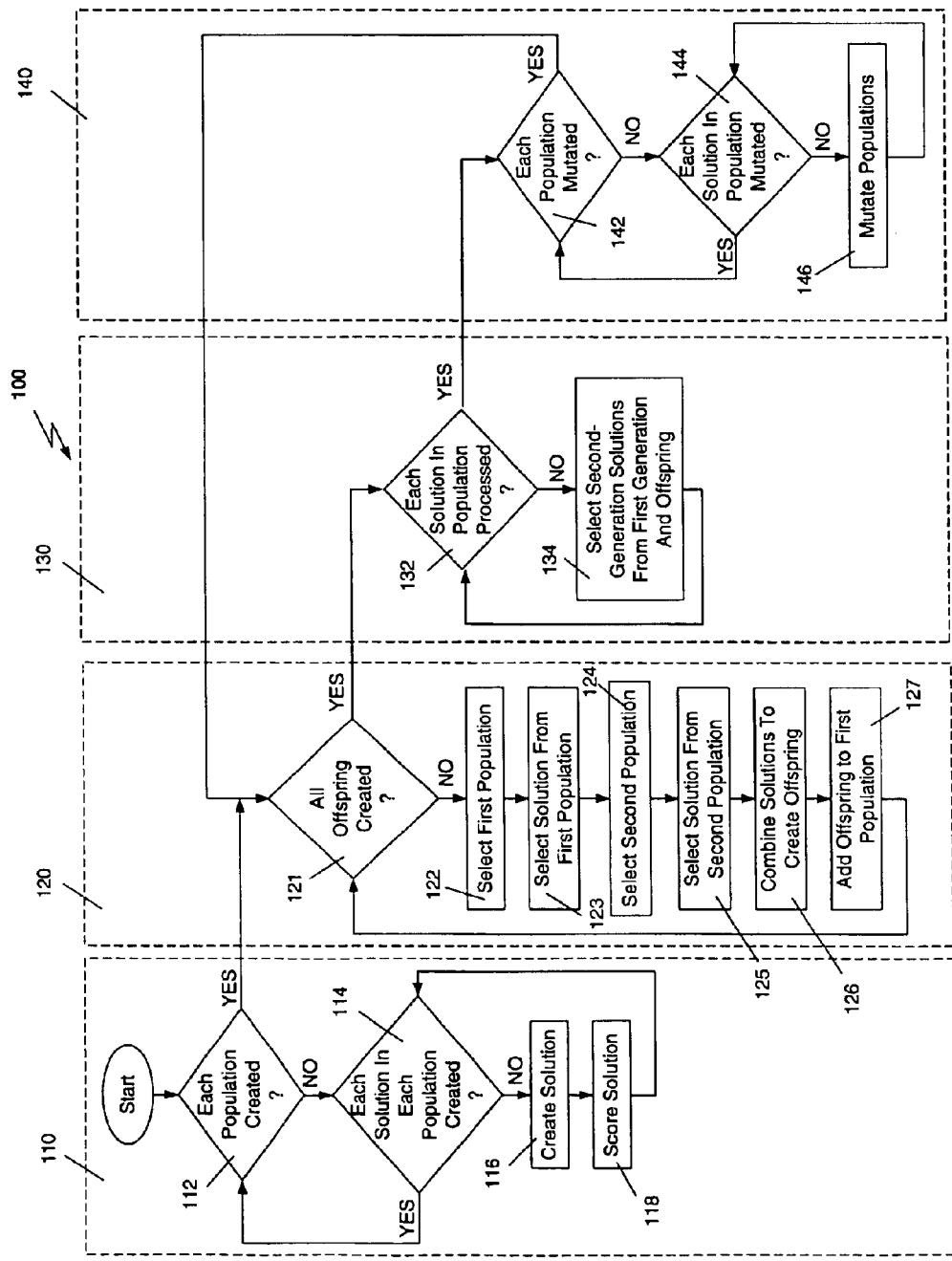
FIG. 4 shows a more detailed flow chart of the method of FIG. 1

FIG. 4 shows a more detailed flow chart of the method 100 of FIG. 1. Separate populations 10 of solutions 22 are created 110 by determining 112 whether a desired number of populations 10 have been created, and determining 114 whether a desired number of solutions 22 have been created for each population 10. Until the population creation process 110 is completed, a solution 22 is created 116 within the population 10. The solution 22 may be created, for example, at random. Each solution 22 is rated 118, or scored 118, based on its result, according to defined criteria. More optimal solutions will have scores that reflect that fact.

After the populations 10 have been created 110, the solutions 22 are cross-bred 120 combining solutions 22 from one population 10 with solutions 22 from another population 10. In one embodiment, the solutions 22 are kept separate until except during cross-over 120. The method 100 determines 121 whether all of the offspring solutions 32 have been created. Until each solution 22 is processed 121, a first population 10 and solution 22 within that first population are selected 122, 123. A second population 10 and solution 22 within that second population 10 are then selected 124, 125 to cross-breed with the solution 22 from the first population 10. The solutions 22 are combined 126 to create an offspring solution 32, which is then added 127 to the first population 10. As part of the cross-over process 120 the offspring solutions are scored based on their desirability. As used herein, a "score" refers to any measure of the desirability of a solution 22. The cross-bred solutions 22 may be referred to as the parents or the previous generation of solutions. Offspring may be scored based on any criteria defined by the user. In one embodiment, the offspring is associated with the first population 10 but is maintained separately. In an alternative embodiment, offspring are stored in a single data file along with parent solutions 22 from the same population 10.

In one embodiment, each solution 22 from the first population 10 may be crossed with a solution 22 from the same second population 10. In other embodiments, the solutions 22 from the first population 10 may be combined with solutions 22 from various other populations 10. The solutions 22 that are combined during cross-over 120 may be selected 122, 123, 124, 125 in a pre-defined manner, or randomly. For example, in one embodiment the first solution 22 in the first population 10 may be combined with the first solution 22 in the second population 10, the second solution 22 from the first population 10 may be combined with the second solution 22 in the second population 10, etc. In another embodiment, the solutions 22 may be combined randomly. Each solution 22 in the first population 10 may be combined with different solutions 22 from other populations 10, or the same solution 22 from the other population 10 may be combined with more than one solution 22 from the first population 10. In one embodiment, each solution 22 in the first population 10 may not be combined during cross-over 120, while in other embodiments each solution 22 in the first population 10 is cross-bred 120. In one embodiment, each solution 22 in the first population 10 generates one offspring 32, while in other embodiments, the total number of offspring 32 may be different than the number of parent solutions 22 in the first population 10.

After the cross-over 120, the selection process 130 occurs to identify the more optimal solutions. The selection process 130 occurs until each solution 22, 32 in the population 10 is processed. For each solution, the selection process 130 selects 134 a next-generation solution 42 based on the solutions' scores. The selection process 130 may apply to both the parent solutions 22 and the offspring 32. The selected solutions 42 may be referred to as the next generation, or the second generation in the example of FIG. 4. The second generation 40 may include solutions 42 from both the parents and their offspring, depending upon the selection process. In one embodiment, the selection process 130 may require a particular score in order to be selected. In another embodiment, the selection process 130 may select a predetermined number of solutions for each population—for example, the most desirable 50 scores for each population. The non-selected solutions 22, 32 may be discarded, if desired. The cross-over 120 and selection 130 processes may be repeated as desired, such that the second generation solutions are then crossed with solutions from other populations 10. In one embodiment, second-generation solutions 42 from a first population 10 are crossed with second-generation solutions 42 from a second population 10.

In the embodiment of FIG. 4, a mutation step 140 is shown to illustrate that the method 100 may be implemented to include known genetic algorithms. Each population 10 and each solution within each population may be processed 142, 144 separately. For each solution, the mutation step 140 mutates 146 using known methods of mutation. The mutation step 140 may introduce a particular characteristic to the solutions. In the example of FIG. 4, the cross-over, selection, and mutation steps 120, 130, 140 are then repeated as desired.

By way of example, the method 100 and system may be implemented to design the layout of an integrated circuit chip. The chip design may comprise numerous interconnected hierarchical cells capable of being positioned in various locations on the chip. The method 100 may be used to identify the most efficient layout of those cells. The layout of the cells may have certain rules, for example, rules that prevent multiple cells from occupying the same place on the chip. The layout may have certain desired characteristics such as timing between certain cells, overall length of transmission lines connecting cells, proximity between cells, overall area consumed by the design, etc. The score or rating of a particular design may reflect how well the design comports with the desired characteristics.

Multiple separate populations 10 may be created 110, each population 10 comprising multiple data entries 22, each of which represents a possible layout solution 22. Initially, the layout solutions 22 may be selected randomly, or through any other method. The group of initial parent layout solutions 22 for each population 10 may be referred to as the first generation 20. One layout solution 22 from a first population 10 may then be combined 120 with a layout solution 22 from another population 10 to create an offspring layout solution 32. This offspring solution 32 is then associated with at least one of the parent populations 10. The group of offspring solutions 32 is referred to generally as the offspring 30. Each parent solution 22 and offspring solution 32 has a score. When the cross-over process 120 is complete, all of the layout solutions 22, 32 within each population 10—the offspring 32 and parent solutions 22—are compared during a selection, or competition, process 130. The most desirable solutions for each population 10—those having the best scores—are retained in the population 10 and the less desirable solutions 22, 32 are discarded. This process of cross-over 120 and selection 130 repeats itself through many iterations until an optimal solution is discovered. During this process, known genetic methods such as mutation or intra-population breeding may be employed as desired.

Figure 5:
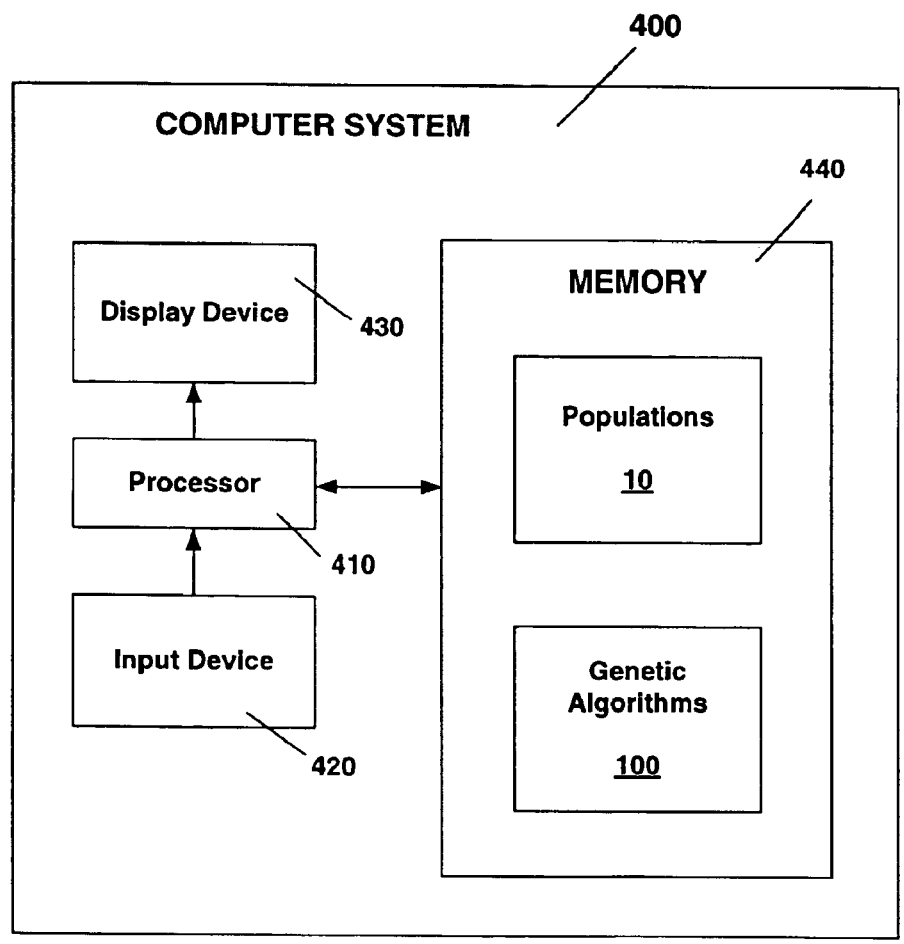
FIG. 5 shows a block diagram of a computer system that uses the method.

FIG. 5 shows a block diagram of a computer system 400 having a processor 410 connected to an input device 420 and a display device 430. The processor 410 accesses memory 440 in the computer system 400 that stores populations 10 of solutions 22. The memory 440 also stores a software application having instructions that apply the method 100. In use, the input device 420 receives commands instructing the processor 410 to call the software algorithm 100 to perform cross-over, selection, and other steps 120, 130 of the method 100. The results of the method 100, such as the second-generation solutions 42, may be displayed on the display device 430.

Although the present invention has been described with respect to particular embodiments thereof, variations are possible. The present invention may be embodied in specific forms without departing from the essential spirit or attributes thereof. Although the invention is described as being implemented in connection with a circuit design layout, one skilled in the art will recognize that the method and system may be employed in connection with any application where a genetic algorithm may be helpful. One skilled in the art will recognize that such applications include by way of example, but are not limited to, the optimization of manufacturing flow scheduling, Boolean logic synthesis, printed circuit board routing and integrated circuit routing, optimization of fuel consumption for rail transportation, petroleum production optimization, traffic routing in a telecommunications network, optimization of publication layouts, image classification, handwriting recognition, and routing and scheduling for buses, public transportation, delivery services, etc. In addition, although aspects of an implementation consistent with the present invention are described as being stored in memory, one skilled in the art will appreciate that these aspects can also be stored on or read from other types of computer program products or computer-readable media, such as secondary storage devices, including hard disks, floppy disks, or CD-ROM; a carrier wave from the Internet or other network; or other forms of RAM or read-only memory (ROM). It is desired that the embodiments described herein be considered in all respects illustrative and not restrictive and that reference be made to the appended claims and their equivalents for determining the scope of the invention.

What is claimed is:

1. A method, comprising code executable on a general purpose computer, of selecting a solution for optimum layout of an integrated circuit, comprising:

creating first and second separate populations of parent solutions;

combining at least one of the parent solutions from the first population with at least one of the parent solutions from the second population to create offspring solutions;

adding the offspring solutions to the first population; and selecting second-generation solutions of the integrated circuit layout for the first population from the offspring solutions and the parent solutions.

2. The method of claim 1, further comprising keeping the second-generation solutions and discarding all remaining solutions in the first population.

3. The method of claim 1, further comprising associating scores with each of the parent solutions and offspring solutions, and wherein the step of selecting comprises selecting the second-generation solutions based on the scores.

4. The method of claim 1, further comprising combining at least one of the second-generation solutions from the first population with at least one second-generation solution from the second population.

5. The method of claim 1, further comprising mutating at least one of the second-generation solutions.

6. The method of claim 1, further comprising keeping the first population separate from the second population.

7. The method of claim 1, wherein the step of combining comprises combining each of the parent solutions in the first population with at least one of the parent solutions in the second population.

8. A computer-readable medium having computer-executable instructions for performing a method on a computer for selecting solution for optimum layout of an integrated circuit, the method comprising:

combining at least one parent solution from a first population with at least one parent solution from a second population to create offspring solutions;

associating the offspring solutions with the first population; and selecting second-generation solutions of the integrated circuit layout for the first population from the offspring solutions and the first population parent solutions.

9. The medium of claim 8, wherein the method further comprises keeping the second-generation solutions and discarding all remaining solutions in the first population.

10. The medium of claim 8, wherein the method further comprises associating scores with each of the parent solutions and offspring solutions, and wherein the step of selecting comprises selecting the second generation solution based on the scores.

11. The medium of claim 8, wherein the method further comprises combining at least one of the second-generation solutions from the first population with at least one second-generation solution from the second population.

12. The medium of claim 8, wherein the method further comprises mutating at least one of the second-generation solutions.

13. The medium of claim 8, wherein the method further comprises keeping the first population separate from the second population.

14. The medium of claim 8, wherein the step of combining comprises combining each of the parent solutions in the first population with at least one of the parent solutions in the second population.

15. A computer system comprising:

a storage medium; and a processor for executing a software program stored on the storage medium for selecting a solution for optimum layout of an integrated circuit, the software program comprising a set of instructions for:

combining at least one parent solution from a first population with at least one parent solution from a second population to create offspring solutions;

associating the offspring solutions with the first population; and selecting second-generation solutions of the integrated circuit layout for the first population from the offspring solutions and first population parent solutions.

16. The system of claim 15, wherein the set of instructions further comprises a set of instructions for keeping the second-generation solutions and discarding all remaining solutions in the first population.

17. The system of claim 15, wherein the set of instructions further comprises a set of instructions for associating scores with each of the parent solutions and offspring solutions, and wherein the step of selecting comprises selecting the second generation solutions based on the scores.

18. The system of claim 15, wherein the set of instructions further comprises a set of instructions for combining at least one of the second-generation solutions from the first population with at least one second-generation solution from the second population.

19. The system of claim 15, wherein the set of instructions further comprises a set of instructions for mutating at least one of the second-generation solutions.

20. The system of claim 15, wherein the set of instructions for combining comprising combining each of the parent solutions in the first population with at least one of the parent solutions in the second population.

* * * * *